(12) United States Patent
Nojima et al.

(10) Patent No.: US 6,184,668 B1
(45) Date of Patent: Feb. 6, 2001

(54) VOLTAGE SENSING CIRCUIT AND METHOD FOR PREVENTING A LOW-VOLTAGE FROM BEING INADVERTENTLY SENSED AS A HIGH-VOLTAGE DURING POWER-UP OR POWER-DOWN

(76) Inventors: Isao Nojima, 475 Knoll Dr., Los Altos, CA (US) 94022; Hung Nguyen, 3272 Winding Vista Common, Fremont, CA (US) 94539

( * ) Notice: Under 35 U.S.C. 154(b), the term of this patent shall be extended for 0 days.

(21) Appl. No.: 09/337,569

(22) Filed: Jun. 22, 1999

(51) Int. Cl.[7] ....................................................... G05F 5/00
(52) U.S. Cl. ............................................. 323/299; 323/303
(58) Field of Search ..................................... 323/273, 281, 323/299, 303, 312, 274, 275, 276, 277

(56) References Cited

U.S. PATENT DOCUMENTS 4,716,307 * 12/1987 Aoyama ............................ 323/303 X
5,471,130 * 11/1995 Agiman ................................ 323/303

* cited by examiner

*Primary Examiner*—Jessica Han
(74) *Attorney, Agent, or Firm*—Limbach & Limbach LLP; Ronald L. Yin

(57) ABSTRACT

A high-voltage sensing circuit is provided that inhibits or prevents a low-voltage from being inadvertently sensed as a high-voltage during power-up and power-down and triggering a high-voltage operation such as a chip erase. The high-voltage sensing circuit comprises a low-power supply sensing circuit for generating a control signal in response to the detection of a power supply level and a switch, controlled by the control signal, that receives the input voltage and passes an output voltage if the input voltage is greater than a reference voltage. Until the power supply exceeds a certain amount, a switching transistor will be OFF and VIN (the output of the charge pump) will not be high enough. Thus, a low-voltage is prevented from being inadvertently sensed by the high-voltage sensing circuit as a high-voltage and triggering a high-voltage operation such as a chip erase.

7 Claims, 5 Drawing Sheets

VOLTAGE SENSING CIRCUIT AND METHOD FOR PREVENTING A LOW-VOLTAGE FROM BEING INADVERTENTLY SENSED AS A HIGH-VOLTAGE DURING POWER-UP OR POWER-DOWN

BACKGROUND OF THE INVENTION

1. Technical Field of the Invention

The present invention relates to voltage sensing in an integrated circuit, and more specifically, to a high-voltage sensor that prevents a low-voltage from being inadvertently sensed as a high-voltage during power-up and power-down and triggering an unintentional operation.

2. Background of the Related Art

Many integrated circuits require high-voltage sensor circuitry to detect higher than power supply ($V_{CC}$) voltage levels in order to carry out operations such as read/write and erase. For example, on a flash memory EEPROM device, a low-voltage supplied to the device may indicate a read operation is to be performed, whereas a high-voltage (12V) supplied to the device (or internally generated via an on-board charge pump) may indicate a program operation or an erase operation is to be performed.

Therefore, in operation, high-voltage sensor circuitry detects the high-voltage, and in response, provides an output signal to other circuitry in the device to cause the device to enter a special operational mode (e.g., program, erase or test mode), other than a normal mode (e.g., read mode). If the high-voltage sensor does not operate properly, or inadvertently senses a low-voltage as a high-voltage, especially at power-up and power-down, a device such as a non-volatile memory may be erroneously programmed, erased, or stressed.

Normally, the output of a high-voltage sensor circuit provides a low voltage ($V_{SS}$ or GROUND). However, if the input to the circuit is greater than a predetermined voltage level, the output switches to a high-voltage ($V_{CC}$, the power supply voltage). The switch to the high-voltage output occurs if the input voltage is greater than a specified reference voltage level higher than the power supply voltage $V_{CC}$.

During the sequence of coupling the power supply voltage $V_{CC}$ to the integrated circuit (power-up), or of de-coupling the power supply voltage from the integrated circuit (power-down), many conventional high-voltage sensor circuits may furnish an output signal erroneously indicating that a high-voltage level has been applied to the device. Typically, these conventional high-voltage sensor circuits are designed to detect high-voltage input levels only during normal operation. Therefore, the conventional high-voltage sensor circuits require that the power-up sequence be followed exactly to ensure that the high-voltage sensor circuit does not erroneously furnish an output signal indicating detection of a high-voltage level.

One such conventional high-voltage sensing circuit is shown in FIG. 1. As shown, the conventional high-voltage sensor 1 comprises a plurality of telescopically interconnected transistors 2a–c, which receive a voltage input, and in accordance therewith, provide a resultant output voltage. Additionally, the sensor 1 comprises a current source 3 and another transistor 4.

Transistor 2a is connected at its source/drain terminal with the input signal VIN and its gate terminal is connected with the other source/drain terminal. Transistor 2b is connected at its source/drain terminal with the respective source/drain terminal of transistor 2a, while its gate terminal is connected with the other source/drain terminal. Therefore, a voltage threshold drop occurs across each of diode-connected transistors 2a and 2b.

Transistor 2c has its source/drain terminal connected with the respective source/drain terminal of transistor 2b. The gate terminal of transistor 2c receives an input voltage source $V_{CC}$. The other source/drain terminal of transistor 2c is connected with a current source 3. The output VOUT of the circuit 1 is provided at node B. Finally, transistor 4 serves as a keeper transistor to keep the node A at a specific voltage range, such that node A does not float.

This conventional circuit suffers from the problems identified above with respect to inadvertent sensing of a low-voltage as a high-voltage during power-up or power-down because the threshold voltage of the gate terminal of FET 2c (which is connected with $V_{CC}$) is still quite low. Thus, there is a need to provide an improved high-voltage sensing circuit that inhibits or prevents a low-voltage from being inadvertently sensed as a high-voltage, primarily during power-up or power-down, and triggering a high-voltage operation such as a chip erase.

SUMMARY OF THE INVENTION

A high-voltage sensing circuit is provided that inhibits or prevents a low-voltage from being inadvertently sensed as a high-voltage and triggering a high-voltage operation such as a chip erase primarily during power-up or power-down.

The high-voltage sensing circuit comprises a high-voltage sensing circuit, a low-power sensing circuit, and a switch. The switch is controlled by the output signal of the low-power sensing circuit. Therefore, when the low-power sensor is activated, operation of the high-voltage sensing circuit is cut-off. When the low-power sensor is deactivated, i.e. the circuit has risen to a high-voltage status, then the high-voltage sensor is activated.

Thus, a low-voltage is prevented from being inadvertently sensed by the high-voltage sensing circuit as a high-voltage and triggering a high-voltage operation such as a chip erase.

DETAILED DESCRIPTION OF THE INVENTION

An improved high-voltage sensing circuit 10 is provided that inhibits or prevents a low-voltage from being inadvertently sensed as a high-voltage and triggering a high-voltage operation such as a chip erase, primarily during power-up or power-down.

Figure 2:
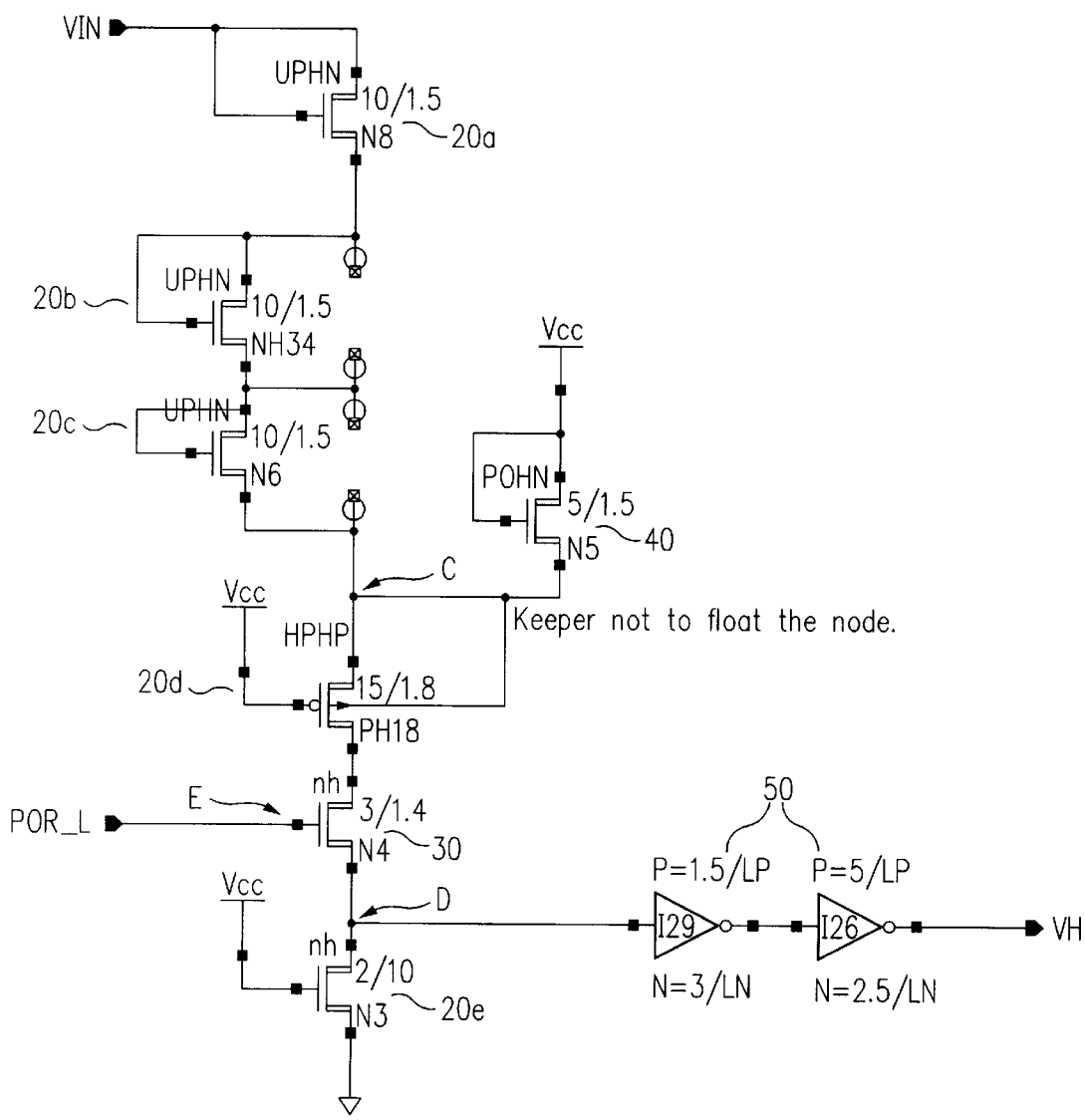
FIG. 2 is a circuit diagram of a high-voltage sensing circuit according to an embodiment of the present invention.

FIG. 2 is a circuit diagram of the high-voltage sensing circuit 10 according to an embodiment of the present invention. As shown in FIG. 2, the high-voltage sensing circuit 10 comprises a plurality of telescopically-connected transistors 20a–e, a switching transistor 30 interposed between transistors 20d and 20e and an additional transistor 40.

Transistor 20a has its source/drain terminal connected with an input voltage source VIN. The gate terminal of transistor 20a is connected with the source/drain terminal, such that transistor 20a is diode-connected.

Transistor 20b has its source/drain terminal connected with the opposing respective source/drain terminal of transistor 20a. The gate terminal is also connected with the source/drain terminal, such that transistor 20b is also diode-connected.

Additionally, transistor 20c has its source/drain terminal connected with the opposing respective source/drain terminal of transistor 20b. The gate terminal of transistor 20c is also connected with the source/drain terminal, such that transistor 20c is additionally diode-connected. Thus, each transistor 20a–c provides a threshold voltage drop $V_t$, with transistors 20a–c providing a total of $3V_t$.

Transistor 20d is a PMOS field effect transistor, while transistor 20e is an NMOS field effect transistor. Each of the respective gate terminals of transistors 20d and 20e is connected to a voltage source $V_{CC}$.

Figure 1:
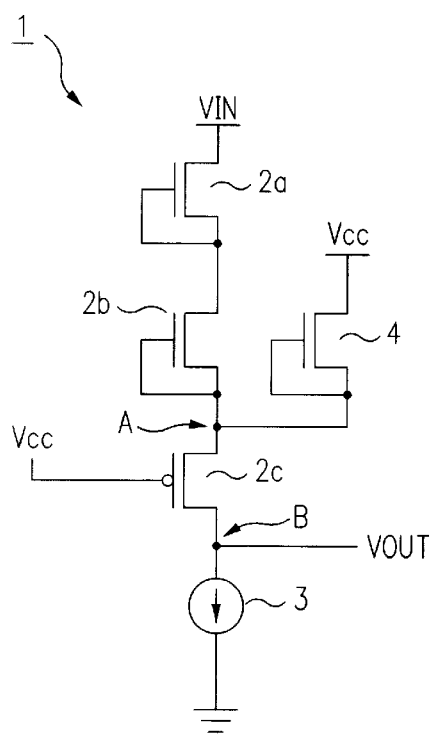
FIG. 1 is a circuit diagram of a conventional high-voltage sensing circuit.
Figure 3:
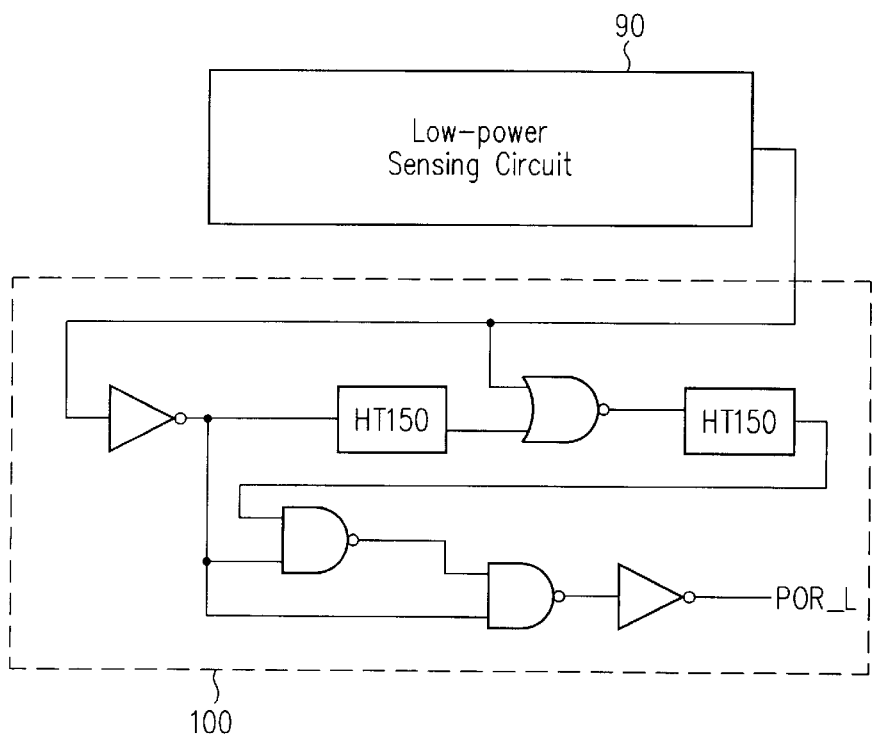
FIG. 3 is a circuit diagram of a low-power sensing circuit that generates signal POR_L.

However, transistors 20d and 20e are separated by a switching transistor 30 that receives, at its gate terminal, signal POR_L, which is the output signal of the low-power sensing circuit 60 to be described herein with reference to FIG. 3. As will be described, depending upon signal POR_L, operation of the voltage sensing circuit 10 can be shutoff.

Still referring to FIG. 2, the switching transistor 30 has a source/drain terminal connected with a source/drain terminal of transistor 20d and another source drain terminal connected with a source/drain terminal of transistor 20e, the opposing source/drain terminal of which is grounded.

Transistor 20d is further coupled by the respective source/drain terminal connection with transistor 20c at node C. Node C serves as a "keeper" node. That is, transistor 40 is diode-connected with its source/drain terminal and gate terminal connected with voltage source $V_{CC}$. The opposing source/drain terminal and the substrate are coupled to node C, such that node C serves as a "keeper" node so as not to float the node.

The output VH of the voltage sensing circuit 10 is provided at node D and propagated through inverter buffers 50. Therefore, in operation, if signal $VIN>V_{CC}+V_{tpl}+3V_t$, where $V_{CC}$ is provided from a voltage source, $V_{tpl}$ is the threshold voltage of the PMOS transistor 20d, and $V_t$ is the threshold voltage of each of the NMOS transistors 20a, 20b and 20c, then output VH is HIGH (VH=1). Therefore, typically, with VCC=3V, VIN=8V, and the current I(IN)=30 μA, then, the high-voltage circuit 10 will be active.

FIG. 3 is a circuit diagram of a low-power sensing circuit 90 that generates signal POR_L. The low-power sensing circuit 90 shown in FIG. 3 is described in Assignee's U.S. Pat. No. 5,181,187 and is herein incorporated by reference in its entirety. In addition, the output of the low-power sensing circuit 90 is coupled to a plurality of logic gates 100 from which signal POR_L is determined.

Figure 4:
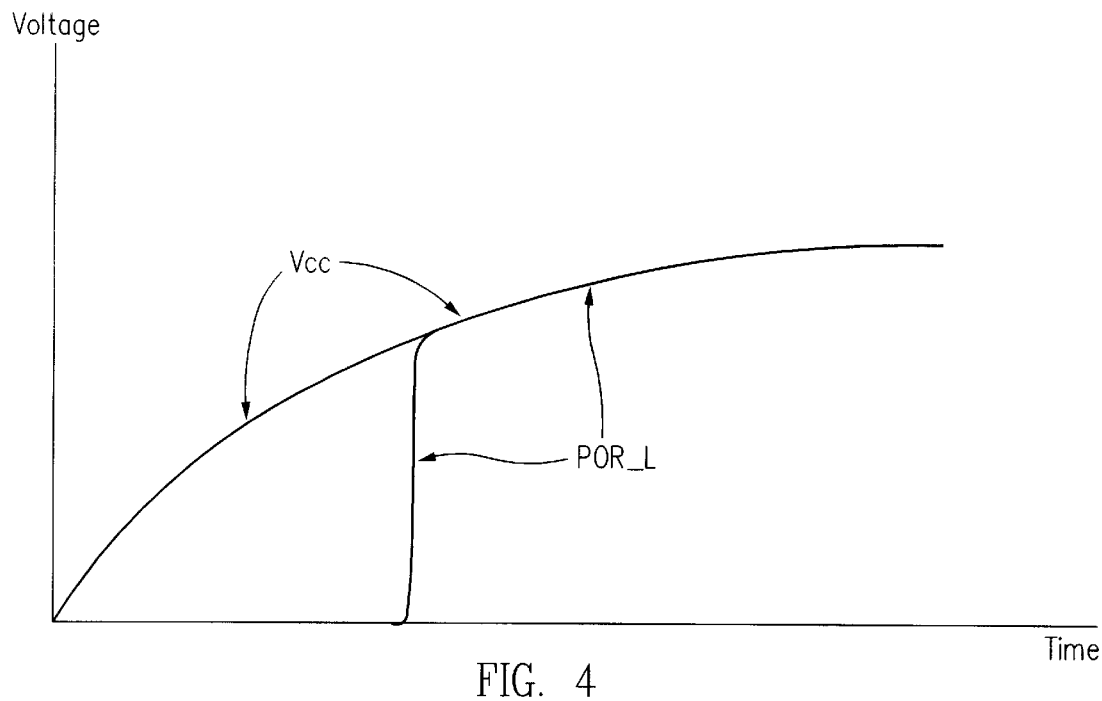
FIG. 4 is a graph of signal POR_L vs. time during the power supply $V_{CC}$ power-up sequence.

FIG. 4 shows a graph of the output voltage signal POR_L with respect to time. As described with reference to FIG. 2, the high-voltage circuit 10 will be operated only if POR_L is a HIGH logic level. Therefore, a low-voltage can be inhibited or prevented from being inadvertently sensed as a high-voltage and triggering a high-voltage operation such as a chip erase, since switching transistor 30 can selectively cut-off the high-voltage sensing circuit 10 if signal POR_L is less than a specific reference voltage.

Figure 5:
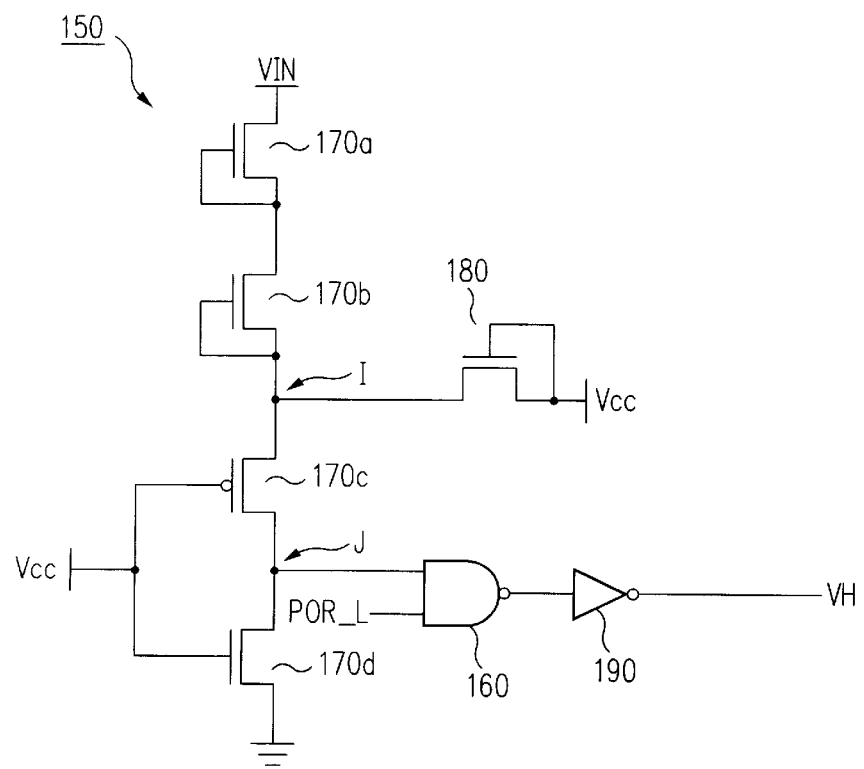
FIG. 5 is a circuit diagram of a high-voltage sensing circuit according to another embodiment of the present invention.

FIG. 5 shows an alternative embodiment of the high-voltage sensing circuit 150. Much of the high-voltage sensing circuit 150 is the same as that shown in FIG. 2. However, instead of comprising a switching transistor, as that of the embodiment of FIG. 2, the voltage sensing circuit 150 shown in FIG. 5 operates on the output signal VH by including a NAND gate 160, the output of which eliminates inadvertent sensing of a low-voltage as a high voltage.

Specifically, the high-voltage sensing circuit 150 shown in FIG. 5 comprises a plurality of telescopically connected transistors 170a–d, a keeper transistor 180 and a NAND gate 160.

Transistor 170a has its source/drain terminal connected with an input voltage source VIN. The gate terminal of transistor 170a is connected with the source/drain terminal, such that transistor 170a is diode-connected.

Additionally, transistor 170b has its source/drain terminal connected with the opposing respective source/drain terminal of transistor 170a. The gate terminal is also connected with the source/drain terminal, such that transistor 170b is also diode-connected. Thus, transistors 170a and 170b each provide a threshold voltage drop $V_t$.

Transistor 170c is a PMOS field effect transistor, while transistor 170d is an NMOS field effect transistor. Each of the respective gate terminals of transistors 170c and 170d is connected to a voltage source $V_{CC}$.

Transistor 170c is coupled by the respective source/drain terminal connection with transistor 170b at node I. Node I serves as a "keeper" node. That is, transistor 180 is diode-connected with its source/drain terminal and gate terminal connected with voltage source $V_{CC}$. The opposing source/drain terminal is coupled to node I, such that node I serves as a "keeper" node so as not to float the node.

The output VH of the voltage sensing circuit 150 is provided at node J and propagated through a two-input NAND gate 160. The other input to NAND gate 160 is the complement of signal POR_L, that is provided by a low-power sensing circuit 90, such as that shown in FIG. 3.

The NAND gate 160 operates on these inputs and provides an output signal that is propagated through inverter buffers 190. Therefore, the NAND gate 160 eliminates the possibility of inadvertent sensing of a low-voltage as a high-voltage, performing a similar function as that of the switching transistor 30 of FIG. 2.

Figures 6A, 6B:
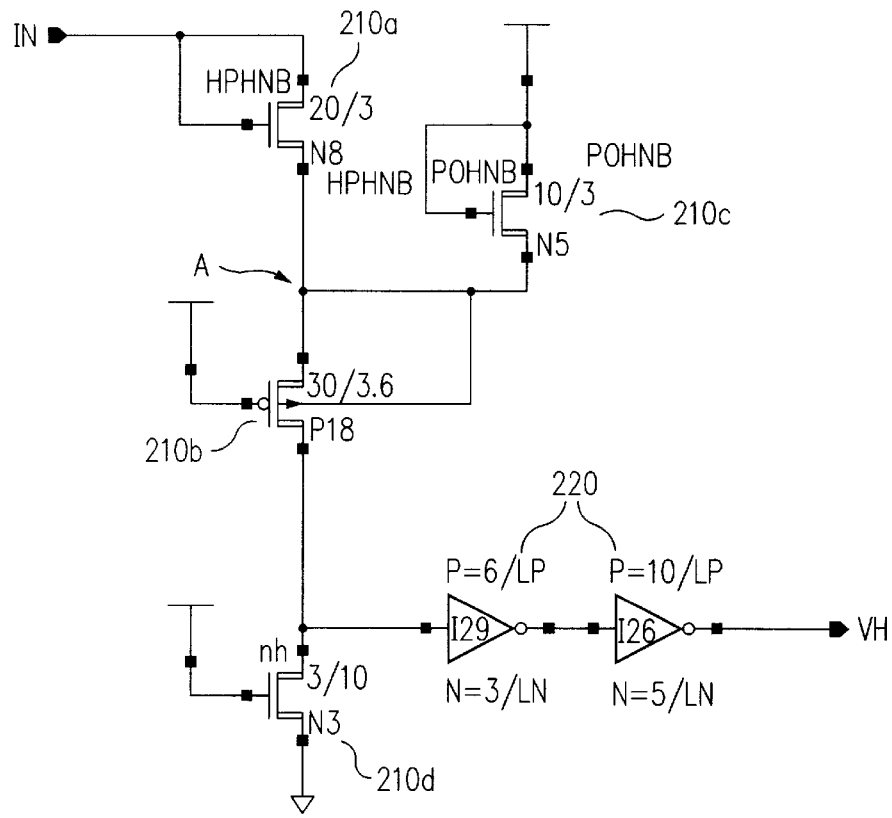
FIG. 6A is a circuit diagram of another conventional high-voltage sensing circuit.
FIG. 6B is a signal graph of the voltage signals of the circuit of FIG. 6A illustrating the high-voltage signal problem inherent to the conventional high-voltage sensing circuit of FIG. 6A.

In order to illustrate the improvement over the prior art, reference will now be made to FIGS. 6A–7B. FIGS. 6A and 6B show a conventional high-voltage sensing circuit 200 and its respective voltage signals ($V_{IN}$, $V_{CC}$ and $V_H$) at different potentials.

In FIG. 6A, transistor 210a is diode connected, in that a source/drain terminal is coupled with the gate terminal. The opposite source/drain terminal of transistor 210a is coupled with a respective source/drain terminal of transistor 210b, while the gate terminal of transistor 210b is connected to $V_{CC}$.

Node A, the like connection between respective source/drain terminals of transistors 210a, 210b is further coupled with a respective source/drain terminal of transistor 210c.

Transistor 210c is also diode connected, in that its source/drain terminal is connected with its gate terminal, each connected to voltage source $V_{CC}$.

The opposite source/drain terminal of transistor 210b is connected with a respective source/drain terminal of transistor 210d to form an inverter. Transistor 210d has its gate terminal connected with $V_{CC}$ while its opposite source/drain terminal is grounded. Output voltage VH is provided as the output of the inverter pair 210b, 210d.

Thus, in operation, when $V_{IN}$=6V, and $V_{CC}$ is charged-up from LOW to HIGH, such as occurs at start-up, output VH is not completely LOW. VH is only LOW from a time T. Prior to time T, output VH may be interpreted as HIGH, which could cause problems in interpretation of voltages for memory purposes.

Figure 7A:
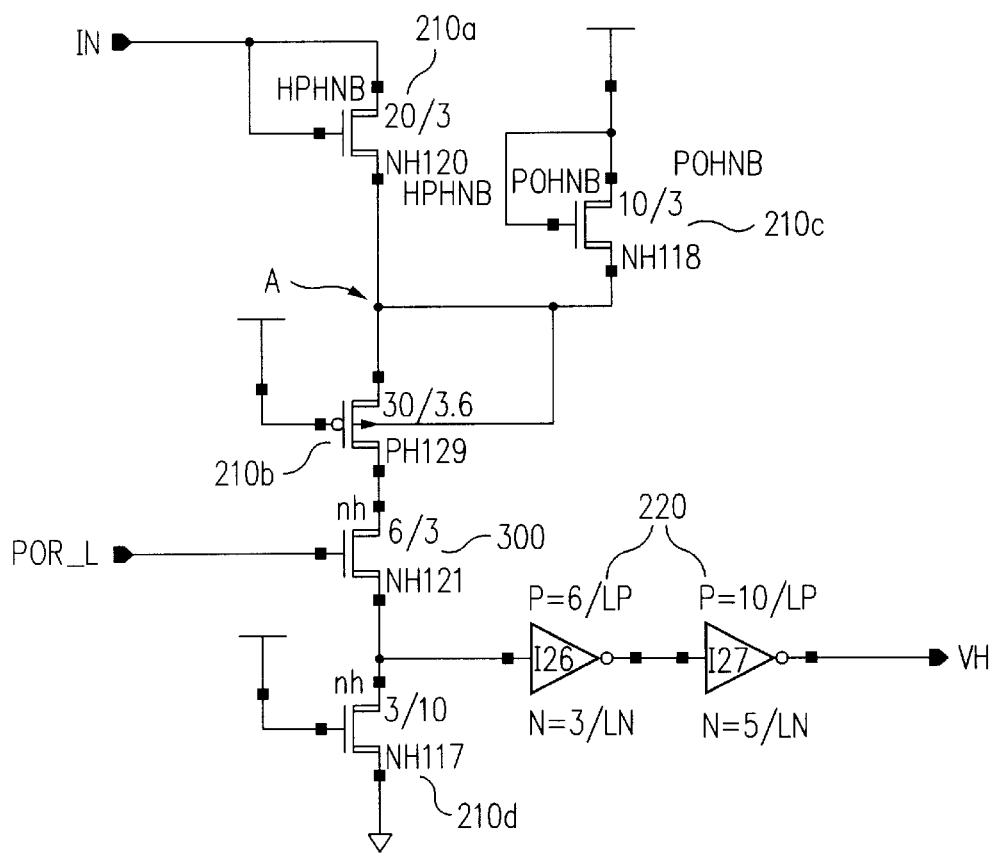
FIG. 7A is a circuit diagram of a high-voltage sensing circuit of another embodiment of the present invention.
Figure 7B:
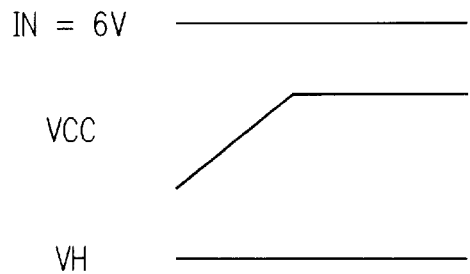
FIG. 7B is a signal graph of the voltage signals of the circuit of FIG. 7A illustrating the controlled high-voltage signal.

In comparison, a low-voltage sensing circuit 300 according to an embodiment of the invention is shown in FIG. 7A, with respective voltage potential levels ($V_{IN}$, $V_{CC}$ and VH) indicated in FIG. 7B. While a majority of circuit 300 resembles the prior art circuit 200, in addition, transistor 310 is sandwiched between transistors 210b and 210d. Transistor 310 receives, at its gate terminal, signal POR_L. Therefore, transistor 310 is controlled by the low-power sensing circuit 90, described in FIG. 3.

In operation, when $V_{IN}$=6V and $V_{CC}$ is charged-up from LOW to HIGH, such as occurs during start-up, voltage VH remains constantly LOW. No voltage spike occurs, such as what occurred in the prior art circuit 200 in FIG. 6A. Therefore, an improved high-voltage sensing circuit can be is provided that inhibits or prevents a low-voltage from being inadvertently sensed as a high-voltage during power-up and power-down and triggering a high-voltage operation such as a chip erase.

It should be noted that the above description is not intended to limit the invention to what is described herein. Additional embodiments of the invention can be performed. For example, while the above-described embodiment provided an internal high-voltage input, an external high-voltage input VIN can be supplied without diverging from the invention. In addition, while the above-described embodiment provided a NAND gate as the logic gate of the voltage sensor circuit, a NOR gate could be provided without diverging from the invention.

What is claimed is:

1. A voltage sensor circuit for receiving an input signal and for preventing said input signal from being inadvertently sensed as a high voltage signal during power up or power down of a supply voltage, said voltage sensor circuit comprising:

a low-power supply sensing circuit for generating a control signal in response to the detection of the voltage of said supply voltage; and a high voltage sensor circuit having an input for receiving the input signal, an output for providing an output signal and for receiving said supply voltage, said high voltage sensor circuit including a switch, interposed between the input and the output, said switch controlled by said control signal, said high voltage sensor circuit for generating said output signal in the event the voltage of said input signal is greater than the voltage of said supply voltage.

2. The voltage sensor circuit of claim 1, wherein said switch comprises a transistor.

3. The voltage sensor circuit of claim 2, wherein said switch is a logic gate.

4. The voltage sensor circuit of claim 3, wherein said logic gate is a NAND gate.

5. The voltage sensor circuit of claim 3, wherein said logic gate is a NOR gate.

6. A voltage sensor circuit for receiving an input signal and for preventing said input signal from being inadvertently sensed as a high voltage signal during power up or power down of a supply voltage, said voltage sensor circuit comprising:

a low-power supply sensing circuit for generating a control signal in response to the detection of the voltage of said supply voltage; and a high voltage sensor circuit having an input for receiving the input signal, an output for providing an output signal, and for receiving said supply voltage, said high voltage sensor circuit including a transistor, interposed between the input and the output, with the source/drain terminal of said transistor receiving said input signal, the gate terminal of said transistor coupled with said low-power supply sensing circuit, receiving said control signal, said transistor passing said output signal if the voltage of said input signal is greater than the voltage of said supply voltage.

7. A method for preventing an input signal having a low-voltage from being inadvertently sensed as a high voltage during power up or power down of a supply voltage, said method comprising the steps of:

generating a control signal in response to said supply voltage exceeding a threshold; and selectively providing an output voltage in response to said control signal if the voltage of said input signal is greater than the voltage of said supply voltage.

* * * * *